(12) United States Patent
Yokoyama et al.

(10) Patent No.: US 11,626,290 B2
(45) Date of Patent: Apr. 11, 2023

(54) METHOD, DEVICE, AND SYSTEM FOR ETCHING SILICON OXIDE FILM

(71) Applicant: TOKYO ELECTRON LIMITED, Tokyo (JP)

(72) Inventors: Osamu Yokoyama, Yamanashi (JP); Kwangpyo Choi, Yamanashi (JP); Kazuki Hashimoto, Yamanashi (JP); Rio Shimizu, Yamanashi (JP); Takashi Kobayashi, Yamanashi (JP); Takashi Sakuma, Yamanashi (JP); Shinya Okabe, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/397,561

(22) Filed: Aug. 9, 2021

(65) Prior Publication Data
US 2022/0051901 A1    Feb. 17, 2022

(30) Foreign Application Priority Data

Aug. 11, 2020    (JP) .............................. JP2020-135972

(51) Int. Cl.
*H01L 21/311*    (2006.01)
*H01L 21/67*    (2006.01)

(52) U.S. Cl.
CPC .. *H01L 21/31116* (2013.01); *H01L 21/67069* (2013.01)

(58) Field of Classification Search
None
See application file for complete search history.

(56) References Cited

U.S. PATENT DOCUMENTS

| 2014/0076849 | A1* | 3/2014 | Moriya | ................ H01L 21/465 |
| | | | | 156/345.24 |
| 2016/0225637 | A1* | 8/2016 | Takahashi | ......... H01L 21/67017 |

FOREIGN PATENT DOCUMENTS

JP    2009-094307 A    4/2009

* cited by examiner

*Primary Examiner* — Roberts P Culbert
(74) *Attorney, Agent, or Firm* — Fenwick & West LLP

(57) ABSTRACT

A method of etching silicon oxide on a surface of a substrate is provided. The method comprises alternately repeating heating the substrate to a heating temperature of 60° C. or higher, supplying hydrogen fluoride gas and ammonia gas onto the substrate to react with the silicon oxide, and modifying the silicon oxide to obtain a reaction product, and removing at least a portion of the reaction product from the substrate while stopping the supply of the above gases and continuing to heat the substrate at the heating temperature; and when a process gas that is at least one of the hydrogen fluoride gas and the ammonia gas is supplied, while continuing to supply the process gas from an upstream side of a flow path, closing a valve disposed in the flow path to pressurize the process gas in the flow path, and then opening the valve.

8 Claims, 17 Drawing Sheets

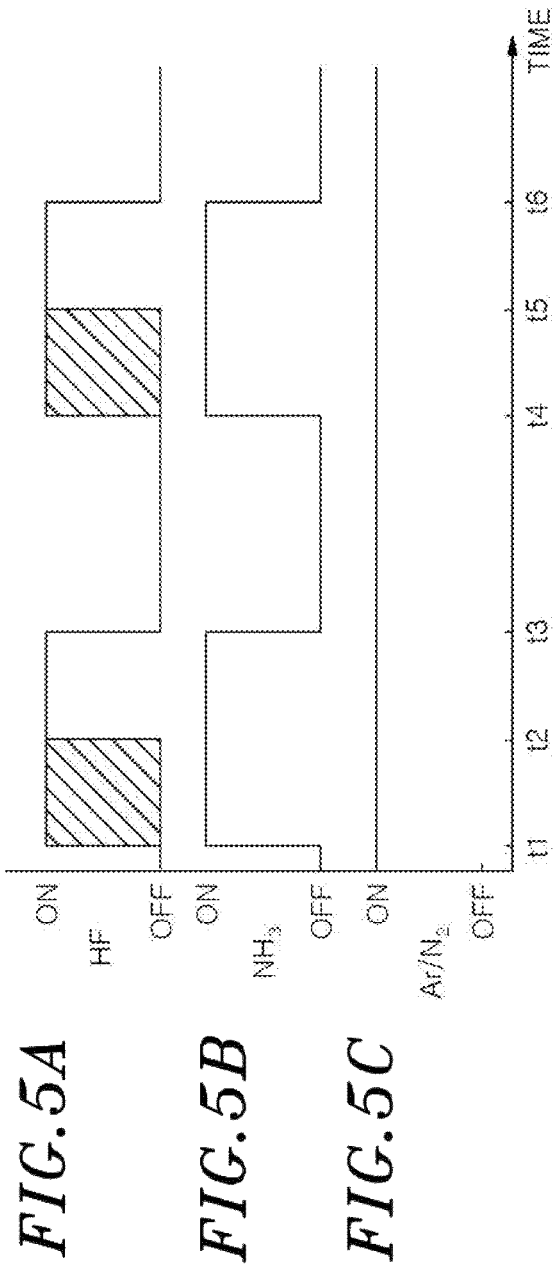

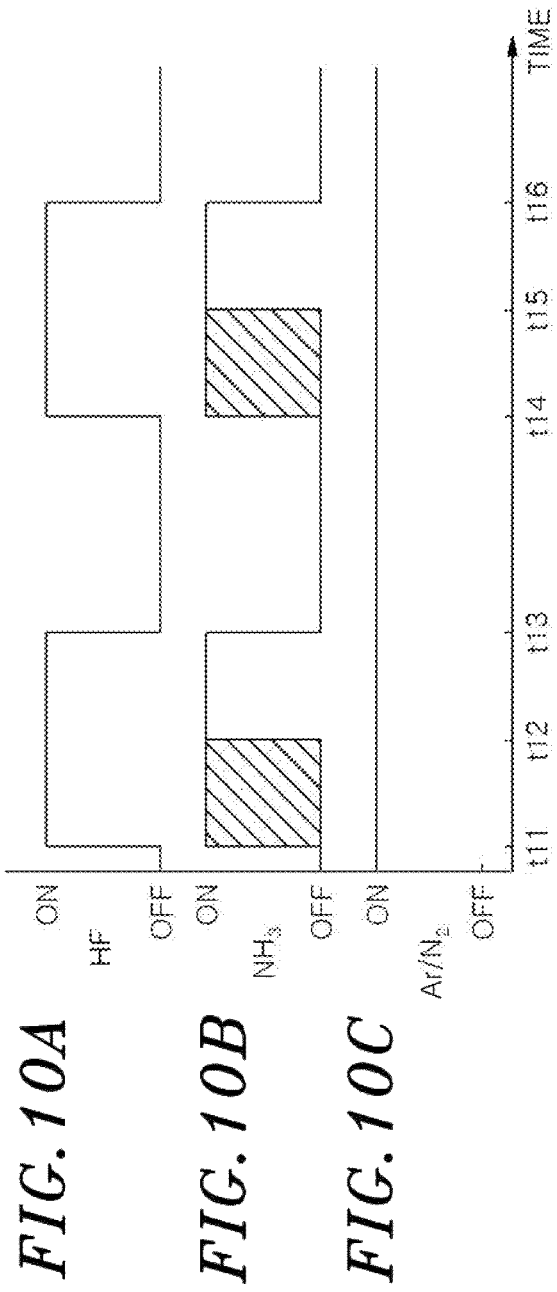

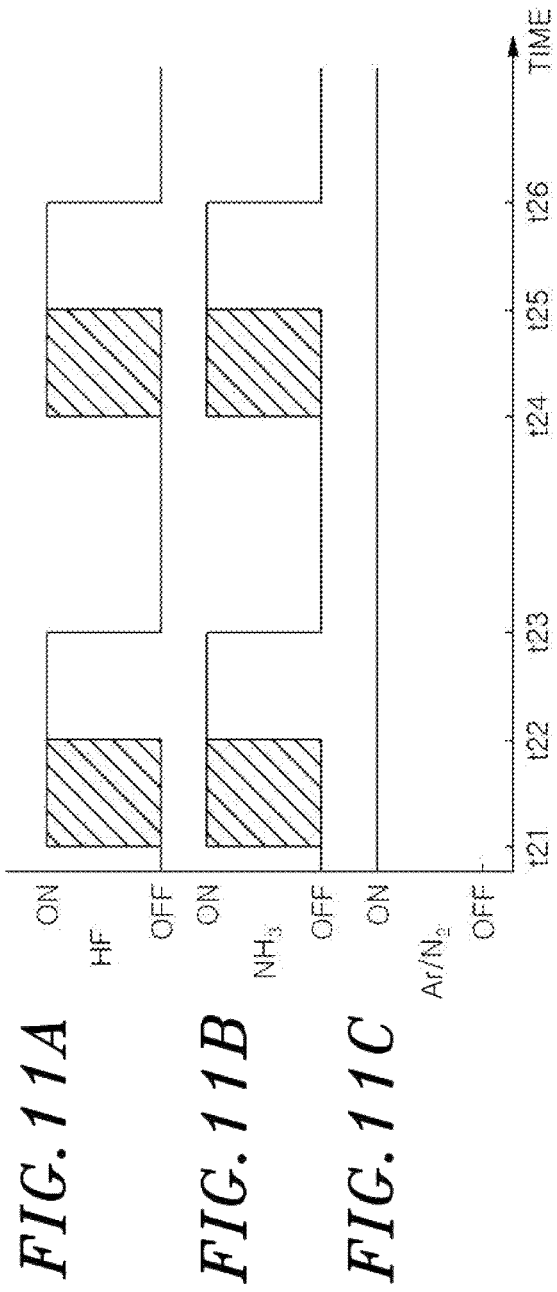

EXAMPLE

COMPARATIVE EXAMPLE

US 11,626,290 B2

METHOD, DEVICE, AND SYSTEM FOR ETCHING SILICON OXIDE FILM

CROSS-REFERENCE TO RELATED APPLICATIONS

This application claims priority to Japanese Patent Application No. 2020-135972, filed on Aug. 11, 2020, the entire contents of which are incorporated herein by reference.

TECHNICAL FIELD

The present disclosure relates to a method, device, and system for etching a silicon oxide film.

BACKGROUND

For example, in a manufacturing process of a field-effect transistor (FET) device, when a recess, such as a trench or the like, is formed on a surface of a substrate, a natural oxide film (silicon oxide film) may be inadvertently formed on a bottom portion of the recess. In such case, the unnecessary natural oxide film is removed by etching. In Japanese Laid-open Patent Publication No. 2009-94307, a method of removing a natural oxide is described in which the natural oxide is modified by the supply of hydrogen fluoride gas and ammonia gas to form a reaction product and then the reaction product is heated and removed.

SUMMARY

The present disclosure is directed to providing a technique in which a silicon oxide film formed on a surface of a substrate is removed by etching.

In accordance with an aspect of the present disclosure, there is provided a method of etching silicon oxide on a surface of a substrate. The method comprises alternately repeating a process of heating the substrate on which the silicon oxide is formed to a heating temperature of 60° C. or higher, supplying hydrogen fluoride gas and ammonia gas onto the substrate to react with the silicon oxide, and modifying the silicon oxide to obtain a reaction product, and a process of removing at least a portion of the reaction product from the substrate while stopping the supply of the hydrogen fluoride gas and the ammonia gas and continuing to heat the substrate at the heating temperature; and when a process gas that is at least one of the hydrogen fluoride gas and the ammonia gas is supplied, while continuing to supply the process gas from an upstream side of a flow path for supplying the process gas to the substrate, closing a valve disposed between the substrate and the flow path to pressurize the process gas in the flow path, and then opening the valve.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIGS. 4A through 4C-2 show longitudinal side views for describing a conventional etching process;

FIGS. 5A through 5C show time charts showing an example of supplying a gas;

FIGS. 10A through 10C show time charts showing another example of gas supply;

FIGS. 11A through 11C show time charts showing still another example of gas supply;

DETAILED DESCRIPTION

Figure 1:
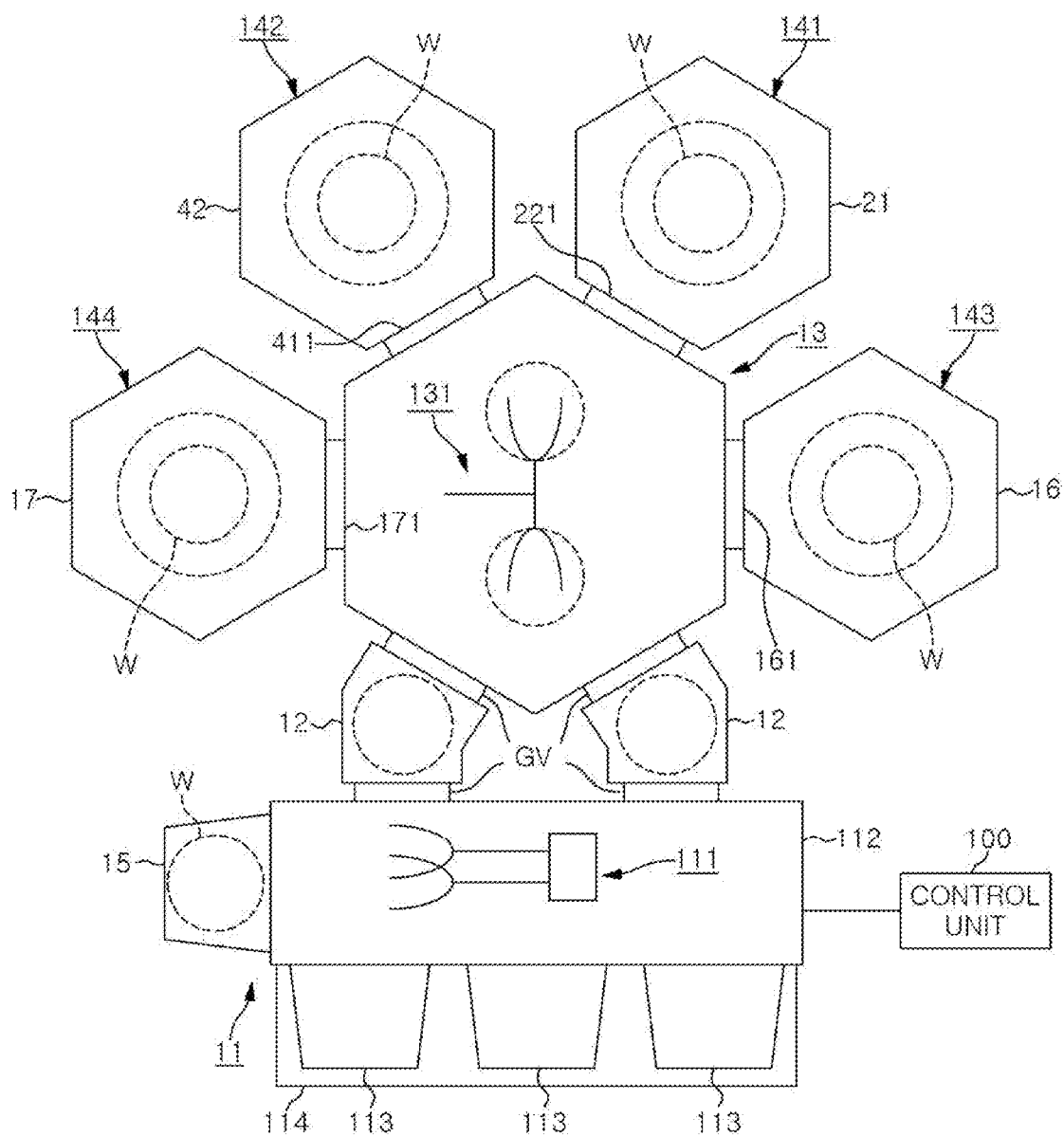
FIG. 1 is a plan view showing an example of an etching processing system in which a method of the present disclosure is performed.

Hereinafter, an example of a wafer processing system in which an etching method of the present disclosure is performed will be described with reference to the accompanying drawings. FIG. 1 is a schematic plan view showing a configuration example of a wafer processing system 1. The wafer processing system 1 includes a loading/unloading unit 11 for loading and unloading a semiconductor wafer (hereinafter, referred to as a "wafer") W, which is a substrate, a load lock chamber 12, a vacuum transfer chamber 13, and a plurality of vacuum processing chambers (e.g., four vacuum processing chambers) 14. The loading/unloading unit 11 includes an atmospheric transfer chamber 112 into which the wafer W is transferred by an atmospheric transfer mechanism 111. For example, two load lock chambers 12 and three carriers 113 by which a plurality of wafers Ws are accommodated are connected to the atmospheric transfer chamber 112, and the wafers Ws are transferred between the carriers 113 and the load lock chambers 12 by the atmospheric transfer mechanism 111. In FIG. 1, reference numeral 114 denotes a carrier mounting unit for mounting the carriers 113, and reference numeral 15 denotes an orienter for positioning the wafer W.

The two load lock chambers 12 are connected to the atmospheric transfer chamber 112 and the vacuum transfer chamber 13 through gate valves GVs, and the atmosphere inside thereof is adjustable between an atmospheric pressure and a vacuum pressure. The vacuum transfer chamber 13 includes a substrate transfer mechanism 131 that transfers the wafer W between each of the load lock chambers 12 and each of the vacuum processing chambers 14. In this example, the vacuum processing chambers 14 are configured as an etching device 141 for performing a chemical oxide removal (COR) process described below and a heating device 142 for performing a post heat treatment refine (PHTR) process described below. Furthermore, the remaining vacuum processing chambers 14 are configured as a film-forming device 143 for performing a film forming process for a titanium (Ti) film and a film-forming device 144 for performing a film forming process for a titanium nitride (TiN) film.

Figure 2:
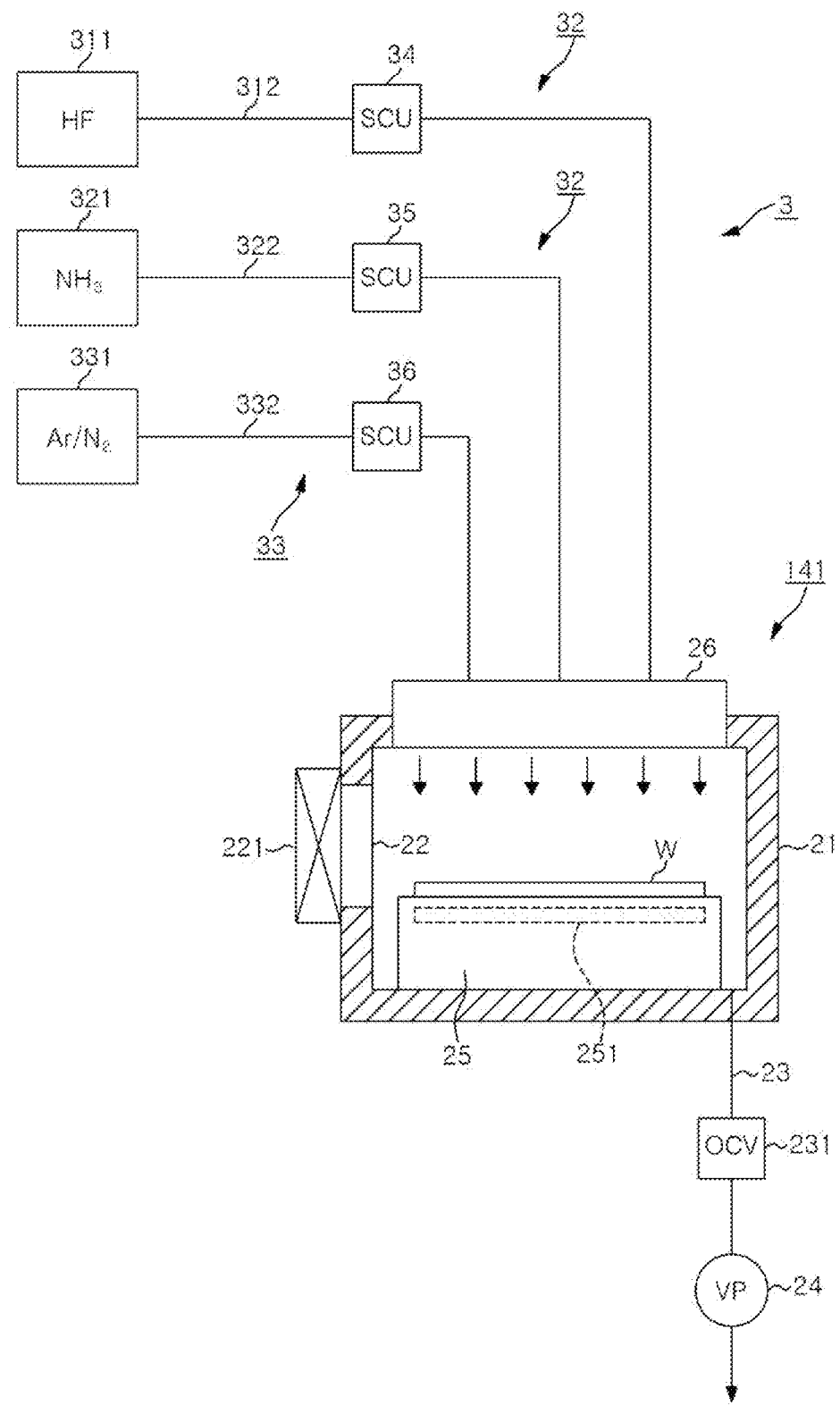
FIG. 2 is a longitudinal side view showing an example of an etching device of the present disclosure.

The etching device 141 includes a processing container (a first processing container) 21 having a sealed structure shown in FIG. 2. The processing container 21 is connected to the vacuum transfer chamber 13 through a carry-in/carry-out port 22 configured to be opened and closed by a gate valve 221 and through which the wafer W is loaded and unloaded, and the wafer W is transferred by the substrate transfer mechanism 131. Further, the processing container 21 is connected to a vacuum exhaust mechanism, for example, a vacuum pump (VP) 24, through an exhaust path 23 having an opening/closing valve (OCV) 231.

A mounting table (a first mounting table) 25 on which the wafer W is mounted substantially horizontally is disposed inside the processing container 21. The mounting table 25 has, for example, a substantially circular shape in a plan view, and includes a heating unit (a first heating unit) 251 therein. For example, the heating unit 251 is configured to adjust the temperature of an upper surface of the mounting table 25 by circulating and supplying a fluid for adjusting temperature through a pipe, and further configured to heat the wafer W mounted on the mounting table 25 to a heating temperature of 60° C. or higher. In addition, the heating unit 251 is not limited to the above, and may be, for example, a heater or the like that heats the mounting table 25 and the wafer W using resistance heat.

A shower head 26 having a plurality of gas discharge holes (not shown) formed on a lower surface thereof is provided on a ceiling portion of the processing container 21 so as to face the mounting table 25, and a gas supply system 3 is connected to the shower head 26. In this example, a process gas can be hydrogen fluoride (HF) gas and ammonia (NH3) gas, and the gas supply system 3 includes a hydrogen fluoride gas supply unit 31, an ammonia gas supply unit 32, and an inert gas supply unit 33.

The hydrogen fluoride gas supply unit 31 includes a supply source 311 for supplying hydrogen fluoride gas and a supply pipe 312 forming a flow path in which a supply control unit (SCU) 34 to be described below is installed, and supplies hydrogen fluoride gas to the processing container 21. The ammonia gas supply unit 32 includes a supply source 321 for supplying ammonia gas and a supply pipe 322 forming a flow path in which a supply control unit (SCU) 35 to be described below is installed, and supplies ammonia gas to the processing container 21. The inert gas supply unit 33 includes a supply source 331 for supplying an inert gas, for example, argon (Ar) gas or nitrogen (N2) gas, and a supply pipe 332 in which a supply control unit (SCU) 36 is installed. Therefore, the inert gas supply unit 33 supplies argon gas or nitrogen gas to the processing container 21.

The supply control units 34 to 36 will be described with reference to FIG. 6. In this example, the supply control unit 34 includes for its supply pipe line 312 a valve V11, a mass flow controller (MFC) M1 constituting a flow rate adjusting unit, a valve V12, a pressure detection unit P1, and a valve V13, which are connected in this order from an upstream side. Further, the supply control unit 35 includes for its supply pipe line 322 a valve V21, a mass flow controller (MFC) M2, a valve V22, a pressure detection unit P2, and a valve V23, which are connected in this order from an upstream side. Furthermore, the supply control unit 36 includes for its supply pipe 332 a valve V31, a mass flow controller (MFC) M3, a valve V32, and a valve V33, which are connected in this order from an upstream side.

In this example, as will be described below, when supplying at least one of hydrogen fluoride gas and ammonia gas, at least one gas is pressurized in the supply pipe. In case that the hydrogen fluoride gas is pressurized, the valve V13 is closed to stop the supply of the hydrogen fluoride gas to the processing container 21 so that the hydrogen fluoride gas is pressurized in the supply pipe 312. Further, when ammonia gas is pressurized, the valve V23 is closed to stop the supply of the ammonia gas to the processing container 21 so that the ammonia gas is pressurized in the supply pipe 322.

Next, the heating device 142 will be described with reference to FIGS. 1 and 3. The heating device 142 includes a second processing container 41 having a sealed structure. The processing container 41 is connected to the vacuum transfer chamber 13 through a carry-in/carry-out port (not shown) configured to be opened and closed by a gate valve 411 and through which the wafer W is loaded and unloaded, and the wafer W is transferred by the substrate transfer mechanism 131. A second mounting table 42 on which the wafer W is mounted substantially horizontally is disposed in the second processing container 41, and a second heating unit 421 is provided inside the second mounting table 42. The second heating unit 421 is comprised of, for example, a heater that heats using resistance heat, and heats the wafer W mounted on the mounting table 42 to a heating temperature higher than the heating temperature of the first heating unit 251. In addition, similar to the first heating unit 251, the second heating unit 421 may heat the wafer W mounted on the second mounting table 42 by circulating and supplying a fluid for adjusting temperature through a pipe.

Further, the heating device 142 includes a supply mechanism 43 for supplying an inert gas, such as nitrogen gas or the like, into the processing container 41. The supply mechanism 43 has a supply source 431 for supplying nitrogen gas and a supply path 433 in which a flow rate adjusting unit 432 is installed, to thereby supply the nitrogen gas into the processing container 41 after opening and closing of the supply path 433 and adjustment of the flow rate of the nitrogen gas are performed by the flow rate adjusting unit 432. Furthermore, the processing container 41 is connected to a vacuum pump (VP) 45 constituting a vacuum exhaust mechanism through an exhaust path 44 including an opening/closing valve 441. In this example, a heating unit for heating nitrogen gas may be provided as the second heating unit to heat the wafer W by supplying the heated nitrogen gas into the processing container 41.

The film-forming device 143 for forming a Ti film and the film-forming device 144 for forming a TiN film respectively include processing containers 16 and 17 into which the wafer W is transferred by the substrate transfer mechanism 131 when gate valves 161 and 171 are opened. For example, the film-forming devices 143 and 144 respectively introduce a film-forming gas for forming a Ti film and a film-forming gas for forming a TiN film into the processing containers and form a Ti film or a TiN film using a chemical vapor deposition (CVD) method, an atomic layer deposition (ALD) method, or the like.

Furthermore, the wafer processing system 1 includes a control unit 100 that controls the operation of each of the components such as the valves V11 to V13 of the hydrogen fluoride gas supply unit 31, the valves V21 to V23 of the ammonia gas supply unit 32, the first and second heating units 251 and 421, the atmospheric transfer mechanism 111, the substrate transfer mechanism 131, the vacuum pumps 24 and 45, and the like. The control unit 100 is configured as, for example, a computer (not shown) including a central processing unit (CPU) and a memory unit, and a program comprising a group of steps (commands) for the control required for performing an etching process of a silicon oxide film, which will be described below, is stored in the memory unit. The program is stored in a storage medium, such as a hard disk, a compact disc, a magnetic optical disk, a memory card, or the like, and installed to the computer from the storage medium.

Figures 1, 4A, 4B, 4C:
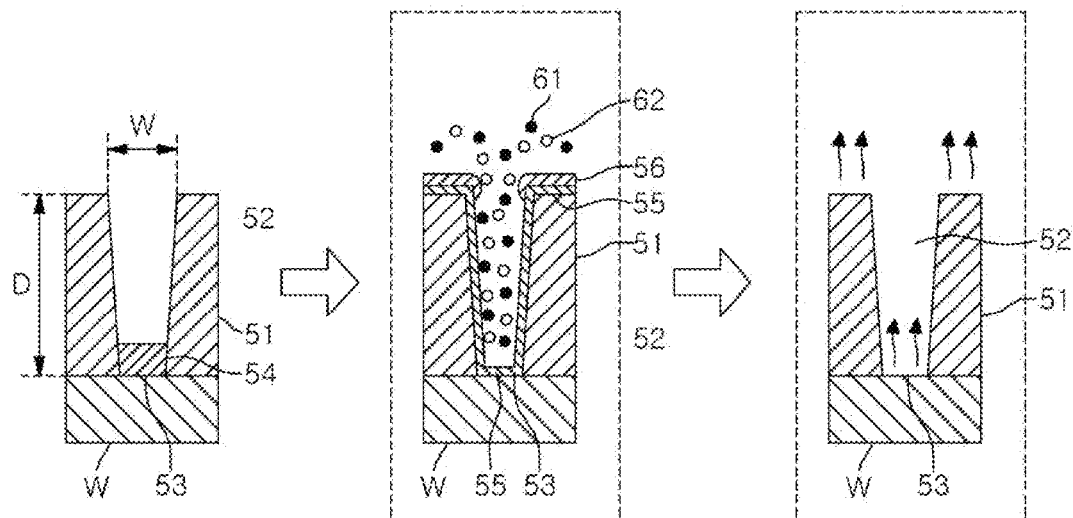

Next, the etching process performed in the wafer processing system 1 will be described. The etching process is performed, for example, as a part of a manufacturing process of a field-effect transistor (FET) device, and a portion of a surface structure of a wafer W to be processed is shown in FIG. 4A. In FIG. 4A, reference numeral 51 denotes an insulating film made of, for example, a silicon oxide film (SiO2 film) or a silicon nitride film (SiN film), and reference numeral 52 denotes a groove (trench) formed in the insulating film 51.

In the manufacturing process of the FET device, after the groove 52 is formed in the insulating film 51 by etching, a metal for interconnection is embedded in the groove 52 through a contact layer made of, for example, a titanium silicide (TiSi) film. On the surface of the wafer W, a natural oxide film (silicon oxide film) 54 may be formed due to a factor such as a contact with the atmosphere when the wafer W is transferred. In this case, when the natural oxide film 54 remains on an inner surface of the groove 52, there is a risk that a resistance value of the device is increased. For this reason, it is required to remove the natural oxide film 54 before forming the contact layer, and in the present disclosure, the natural oxide film 54 is removed by etching.

In the wafer processing system 1 shown in FIG. 1, first, the carrier 113 in which the wafer W to be processed is accommodated is transferred onto the mounting unit 114 of the wafer processing system 1. The wafer W in the carrier 113 is unloaded by the atmospheric transfer mechanism 111, passes through the atmospheric transfer chamber 112, and is loaded into the load lock chamber 12 at an atmospheric pressure. Thereafter, when the load lock chamber 12 is adjusted to the vacuum pressure, the wafer W passes through the vacuum transfer chamber 13 and is transferred to the etching device 141 by the substrate transfer mechanism 131. In the processing container 21 of the etching device 141, after the wafer W is transferred from the substrate transfer mechanism 131 onto the mounting table 25, the processing container 21 is sealed and a COR process starts.

Figures 2, 4B, 4C:
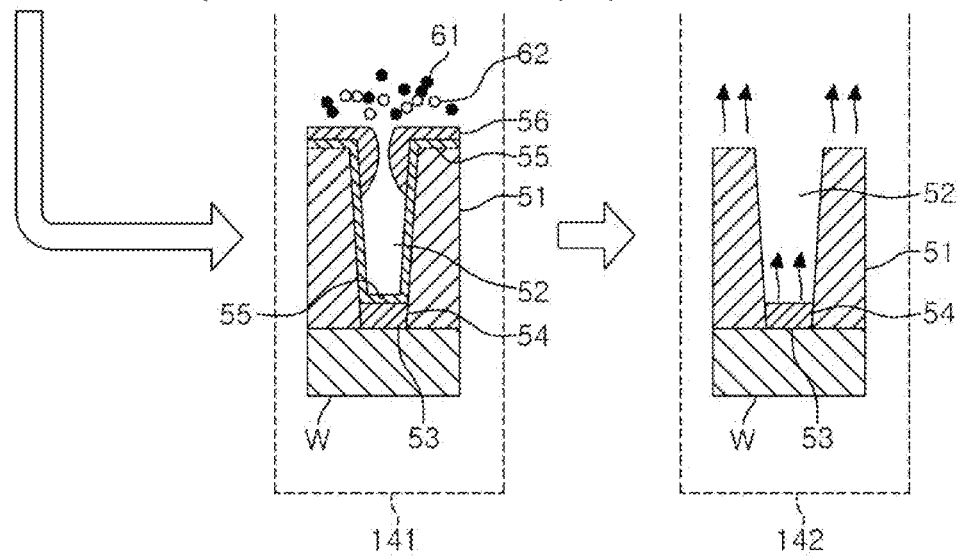

Here, prior to describing the COR process of the present disclosure, a case in which a conventional COR process is performed in the etching device shown in FIG. 2 will be described with reference to FIG. 4. In the COR process, the wafer W is set to a temperature of 60° C. or lower, for example, 27° C. Further, the valves V11 to V13 of the hydrogen fluoride supply unit 31 and the valves V21 to V23 of the ammonia gas supply unit 32 are opened and the hydrogen fluoride gas and the ammonia gas, which are the process gases, are supplied onto the wafer W. It is known that the likelihood that hydrogen fluoride gas and ammonia gas, which are etchants, are absorbed by the wafer W is high at a temperature of 60° C. or lower. For this reason, the etchants are densely adsorbed onto the surface of the wafer W and the hydrogen fluoride gas and the ammonia gas are also adsorbed onto the natural oxide film 54 formed on the inner surface of the groove 52 of the wafer W, and thus etching proceeds. Further, when etching proceeds, the natural oxide film 54, onto which the hydrogen fluoride gas and the ammonia gas are adsorbed, reacts with hydrogen fluoride molecules and ammonia molecules and is modified to a reaction product 55 (see FIG. 4B-1).

The reaction product 55 is ammonium hexafluorosilicate ((NH4)2SiF6: ammonium fluorosilicate (AFS)), moisture, or the like, and the reaction product 55 adheres not only to a bottom portion 53 of the groove 52, but also to an inner side surface of the groove 52 and an upper surface of the insulating film 51 due to the above-described chemical reaction. Further, the gaseous etchant molecules diffuse through the porous reaction product 55 to reach the natural oxide film 54 and the etching proceeds. Further, in the COR process, ammonium fluoride (NH4F) 56 is generated due to the reaction of the hydrogen fluoride gas and the ammonia gas. The gas component of the ammonium fluoride also acts as an etchant and reacts with the natural oxide film 54 to form the reaction product 55. Further, the solid component of the ammonium fluoride is deposited on an upper surface of the reaction product 55, and the deposition amount depends on process conditions, such as a gas flow rate, pressure, temperature, and the like.

The wafer W on which the reaction product 55 or the ammonium fluoride 56 is generated is transferred from the etching device 141 to the heating device 142 where the PHTR process is performed. The PHTR process is a process for sublimating and removing the reaction product 55 and the ammonium fluoride 56 by heating the wafer W. In this way, as shown in FIG. 4C-1, the natural oxide film 54 is removed. In addition, in FIG. 4 and FIG. 9 described below, reference numeral 61 denotes the hydrogen fluoride molecules, and reference numeral 62 denotes the ammonia molecules.

However, recently, with the miniaturization and complexity of the device structure, an opening width of the groove 52 is reduced and a depth of the groove is increased. As described above, in the case of a deep trench whose D/W ratio (i.e., the ratio of a depth D of the groove 52 with respect to an opening width W) is 5 or more), it may be difficult to remove the natural oxide film 54 on the bottom portion 53 of the groove 52. That is, as shown in FIG. 4B-2, since the opening width W of the groove 52 is small, the hydrogen fluoride gas and the ammonia gas cannot easily enter the groove 52 and the solid component of the ammonium fluoride 56 generated due to the reaction is likely to be deposited in the vicinity of the opening of the groove 52. For this reason, the opening of the groove 52 is further narrowed such that entering of the process gas to the interior of the groove 52 gets even more difficult, and thus the process gas is not sufficiently supplied to the interior. As a result, the natural oxide film 54 present on the bottom portion 53 of the groove 52 is not sufficiently etched, and a portion of the natural oxide film 54 remains on the bottom portion 53 even when the PHTR process is performed as shown in FIG. 4C-2.

The etching device 141 according to the present disclosure can perform the COR process that is also applicable to the manufacturing process of the device in which sufficient removal of the natural oxide film 54 was difficult in the conventional method.

Subsequently, the COR process of the present disclosure performed in the etching device 141 will be described with reference to FIGS. 5 to 9. As discussed in the description of the gas supply system 3 of FIG. 2, in the etching device 141 shown in the same drawing, any of the hydrogen fluoride gas and the ammonia gas may be pressurized. In the following description, an example is described in which the hydrogen fluoride gas is pressurized.

Figure 7:
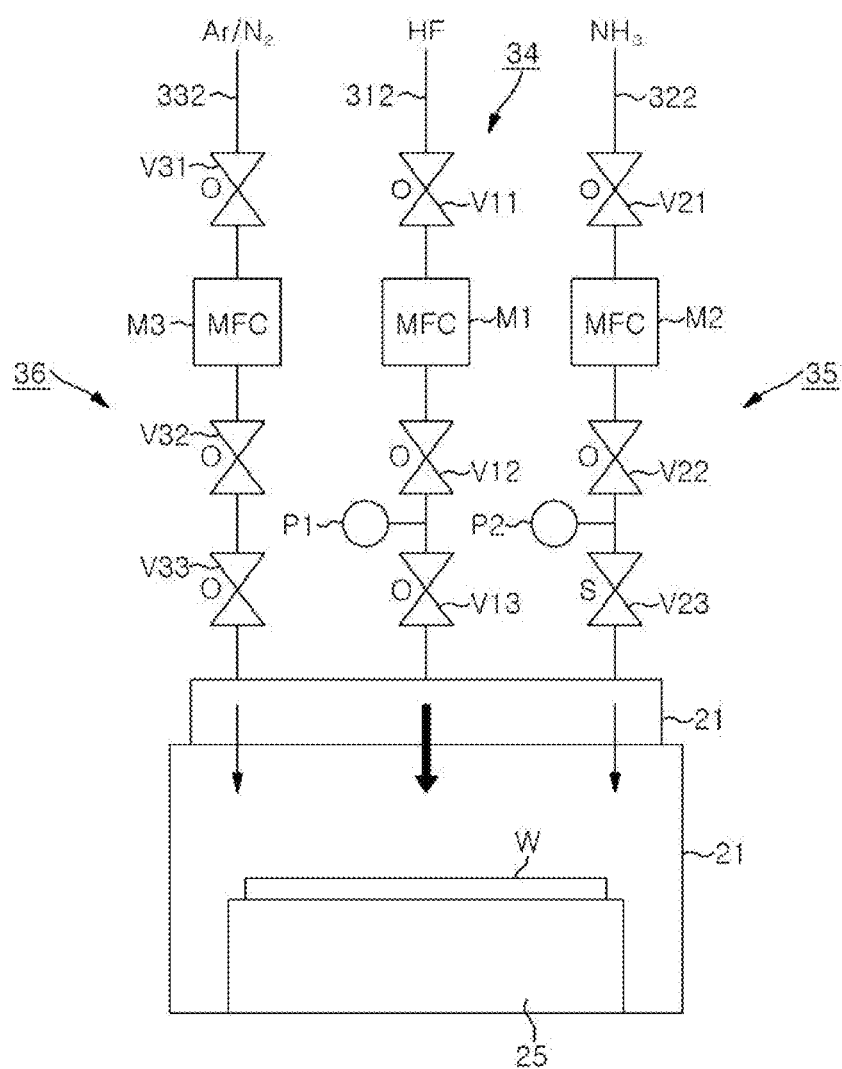
FIG. 7 is a second diagram for describing the operation of the etching device.
Figure 8:
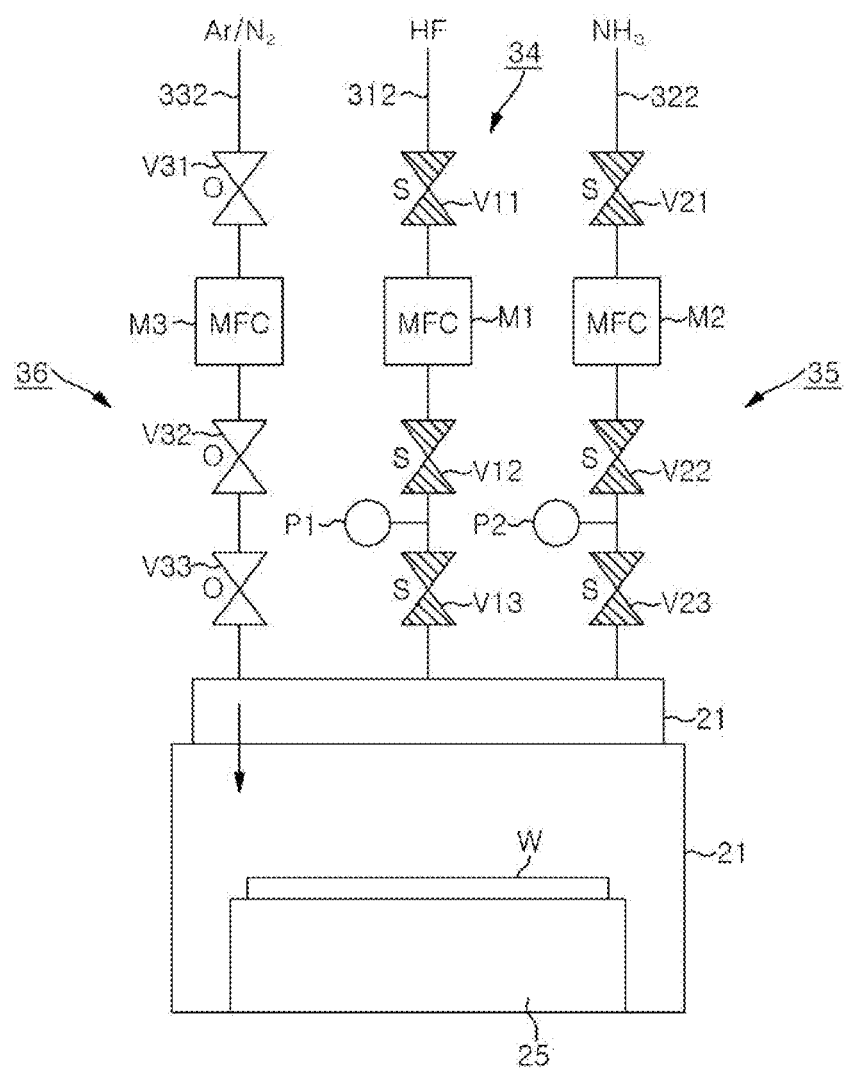
FIG. 8 is a third diagram for describing the operation of the etching device.

FIG. 5 shows time charts representing supply states of hydrogen fluoride gas, ammonia gas, and inert gas (argon gas and nitrogen gas), the horizontal axis representing time and the vertical axis representing gas supply (ON; supply, OFF; stop) for each gas type. FIGS. 6 to 8 show the opening and closing states of the valves of the supply control units 34, 35, and 36, and a symbol "O" is given to a valve in an open state and shown in white, and a symbol "S" is given to a valve in a closed state and shown in black.

In the etching device 141, first, the interior of the processing container 21 is vacuum-exhausted by the vacuum pump 24 and maintained at a set pressure, for example, 13.3 Pa. Further, the valves V31, V32, and V33 of the inert gas supply unit 33 are opened so that the nitrogen gas and the argon gas are continuously supplied. Furthermore, the wafer W on the mounting table 25 is heated by the heating unit 251 to a heating temperature of 60° C. or higher, for example, 90° C.

Figure 6:
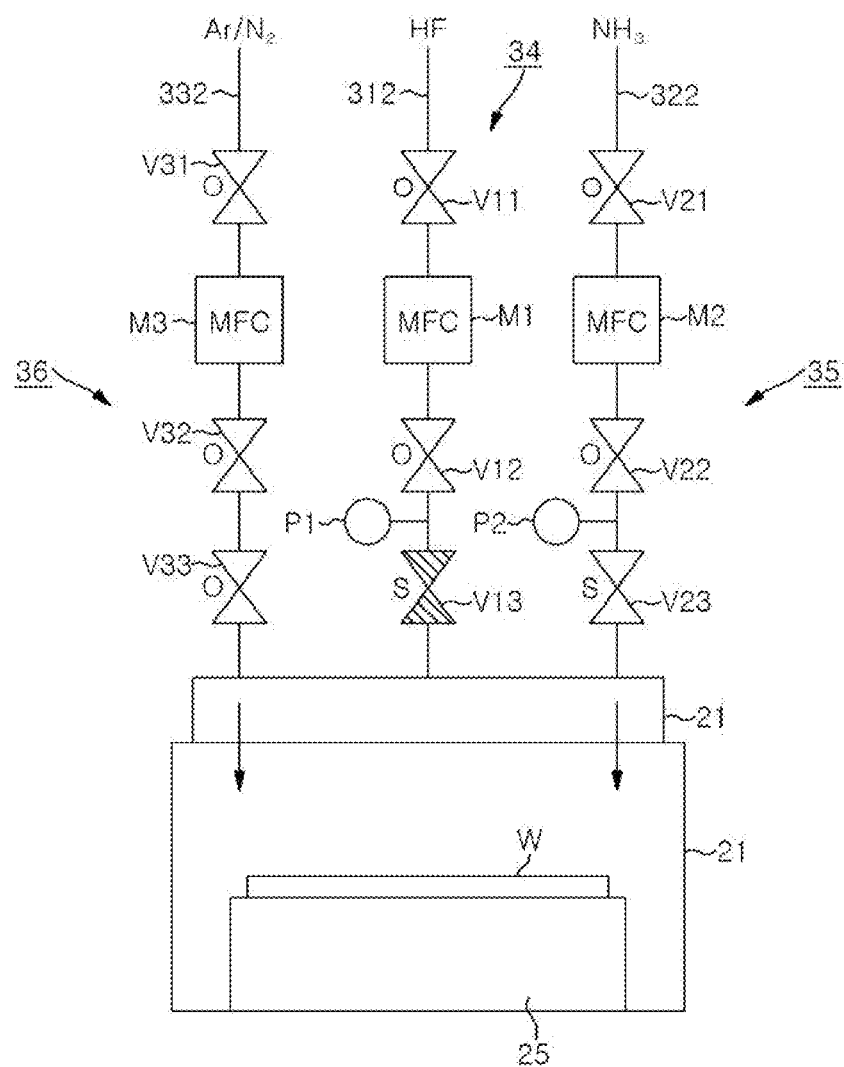
FIG. 6 is a first diagram for describing the operation of the etching device.

Thereafter, as shown in FIG. 6, the valves V21, V22, and V23 are opened so that the ammonia gas is supplied from the ammonia gas supply unit 32 (time t1 in FIG. 5). Meanwhile, in the hydrogen fluoride supply unit 31, the lowermost downstream valve V13 is closed while the valves V11 and V12 are opened. By means of this combination of open and closed states, the hydrogen fluoride gas is continuously supplied from the supply source 311 on the upstream side to the supply pipe 312 which is getting filled with the hydrogen fluoride gas. As a result, the hydrogen fluoride gas in the supply pipe 312 is gradually pressurized. In this way, the valve V13 is closed for a preset period so that the hydrogen fluoride gas in the supply pipe 312 is gradually pressurized, and then, the valve V13 is opened as shown in FIG. 7 so that the hydrogen fluoride gas is supplied into the processing container 21 (time t2 in FIG. 5).

In FIG. 5, a period from the time point t1 to the time point t2 indicates a period for filling the supply pipe 312 with the hydrogen fluoride gas and is shaded with diagonal lines. As can be seen from the supply states of the hydrogen fluoride gas and the ammonia gas shown in FIG. 2, the period in which the pressurized hydrogen fluoride gas is supplied onto the wafer W is shorter than the period in which the unpressurized ammonia gas is supplied onto the wafer W. Further, when the process gas (hydrogen fluoride gas in this example) is pressurized, the supply pipe 312 is preferably filled with the process gas to have a pressure within a range of 6.7 to 66.7 kPa (50 Torr or more and 500 Torr or less). This is because particles may be generated when the pressure in the supply pipe 312 becomes too high.

When the valve V13 is opened, the pressurized hydrogen fluoride gas is vigorously discharged from the supply pipe 312, diffused into the shower head 26, and supplied onto the wafer W on the mounting table 25. Since the ammonia gas is being supplied into the processing container 21, a processing atmosphere composed of the hydrogen fluoride gas and the ammonia gas is formed in the processing container 21. As a result, the natural oxide film 54 formed on the inner surface of the groove 52 in the surface of the wafer W undergoes a chemical reaction with the hydrogen fluoride gas and the ammonia gas and is modified to the reaction product 55, as described above. Further, the ammonium fluoride 56 is generated as a result of the reaction of the hydrogen fluoride gas and the ammonia gas. During the period after the valve V13 is opened, the supply of the hydrogen fluoride gas is continued from the supply source 311 on the upstream side.

When the wafer W is heated to the heating temperature of 60° C. or higher, the reaction products 55 or ammonium fluoride 56 is sublimated while being generated. Since the sublimated reaction product 55 or the like passes through the exhaust path 23 and is discharged from the processing container 21, accumulation of the ammonium fluoride 56 in the opening of the groove 52 is suppressed. To this end, the heating temperature of the wafer W in the first heating unit 251 is preferably 60° C. or higher. Meanwhile, the likelihood that the hydrogen fluoride gas and the ammonia gas are absorbed is decreased as the heating temperature is increased, as will be described below, and thus the heating temperature is preferably 100° C. or lower.

Further, in this example, the hydrogen fluoride gas pressurized in the supply pipe 312 is instantaneously emitted onto the wafer W through the shower head 26. Therefore, a large amount of hydrogen fluoride gas is instantaneously supplied onto the wafer W in a short time, and the adsorption amount of the process gas consisting of hydrogen fluoride gas and ammonia gas is increased. Furthermore, since the hydrogen fluoride gas is vigorously discharged from the shower head 26, the process gas is sufficiently supplied into the groove 52 and reaches the bottom portion 53 even when the groove 52 is a deep trench.

Further, the pressure of the pressurized hydrogen fluoride gas, the opening speed of the valve V13, and the like are set so that there exists a period during which the flow rate of the pressurized hydrogen fluoride gas supplied onto the wafer W becomes greater than the flow rate of a case where the unpressurized hydrogen fluoride gas is continuously supplied onto the wafer. Here, the case where the unpressurized hydrogen fluoride gas is continuously supplied means a case in which the hydrogen fluoride gas is continuously supplied from the time point t1 to a time point t3 in FIG. 5. When the pressurization is performed, a large amount of hydrogen fluoride gas stored in the supply pipe 312 is supplied at one time, and the flow rate of the hydrogen fluoride gas flowing into the processing container 21 is increased. As a result, the amount of hydrogen fluoride that reaches the interior of the groove 52 is also increased. The pressurization of the hydrogen fluoride gas is performed in the supply pipe 312, and the amount of hydrogen fluoride gas with which the supply pipe 312 may be filled is limited. However, in a case that the natural oxide film 54 has been formed in the course of contacting the atmosphere or the like, the natural oxide film 54 to be removed would be sufficiently thin and, thus, may be sufficiently removed by supplying the hydrogen fluoride gas pressurized in the supply pipe 312.

Figures 9A, 9B, 9C, 9D:
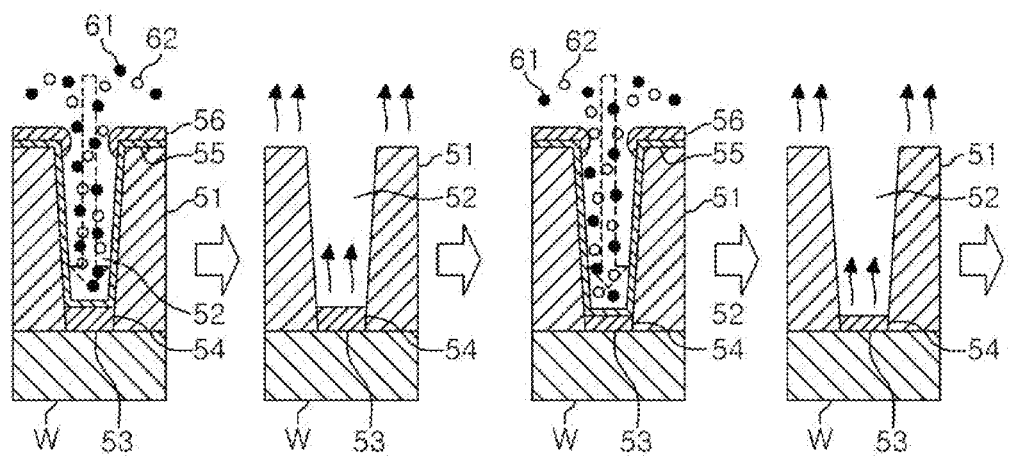
FIGS. 9A through 9D show longitudinal side views for describing an etching process of the present disclosure.

By supplying the hydrogen fluoride gas after the pressurization as described above, the natural oxide film 54 present on the upper surface or the inner side surface of the insulating film 51, as well as the natural oxide film 54 present on the bottom portion 53 of the groove 52, reacts with the process gas, to thereby form the reaction product 55. In FIG. 9A corresponding to the above state, a state is shown in which the reaction product 55 is formed on the surface side of the natural oxide film 54 and the thin ammonium fluoride 56 is deposited in the opening of the groove 52. Meanwhile, the reaction product 55 and the ammonium fluoride 56 are being sublimated by heating the wafer W to 60° C. or higher as described above.

Next, as shown in FIG. 8, the valves V11, V12, and V13 of the hydrogen fluoride gas supply unit 31 and the valves V21, V22, and V23 of the ammonia gas supply unit 32 are closed, to stop the supply of the process gas to the processing container 21 (the time point t3 in FIG. 5). Meanwhile, even when the supply of the process gas stops, the heating unit 251 continues to heat the wafer W at the heating temperature of 60° C. or higher (90° C.), and due to the heating, at least portions of the ammonium fluoride 56 and the reaction product 55 are sublimated. The sublimated reaction product 55 or ammonium fluoride 56 are, by the vacuum pump 24, exhausted from the processing container 21, pass through the exhaust path 23, and are discharged (see FIG. 9B). As a result, a portion of the natural oxide film 54 formed on the inner surface of the groove 52 is etched and removed.

In FIG. 5, a process for obtaining the reaction product 55 by the reaction of the natural oxide film 54 with the process gas is performed from the time point t1 to the time point t3, and a process for heating the wafer W to remove at least a portion of the reaction product is performed from the time point t3 to a time point t4. Further, in the etching device 141, as the COR process, a step of alternately repeating the process for obtaining the reaction product by the reaction of the natural oxide film 54 reacts with the process gas and the process for sublimating the reaction product is performed.

That is, as shown in FIG. 9, a process for re-supplying the process gas onto the wafer W and obtaining the reaction product 55 by the reaction of the natural oxide film 54 with the process gas starts (time point t4 in FIG. 5). In the above process, the opening and closing control of each valve of the hydrogen fluoride gas supply unit 31 and the ammonia gas supply unit 32 is performed in the same manner as described above. In this way, the supply of the ammonia gas starts at the time point t4, and the supply of the pressurized hydrogen fluoride gas starts at a time point t5. Next, at a time point t6, a process for stopping the supply of the process gas, continuing to heat the wafer W, and sublimating and removing the reaction product 55 starts. The number of times (number of cycles) in which these processes are alternately repeated is appropriately set according to the material of the insulating film 51, the shape of the groove 52, the thickness of the natural oxide film 54, and the like. As a result, as shown in FIGS. 9C and 9D, the natural oxide film 54 formed on the bottom portion 53 of the groove 52 is gradually removed.

Preferable ranges of the processing conditions of the above-described COR process and examples thereof will be given. The heating temperature of the mounting table 25 is 90° C. within a range of 60 to 100° C., and the pressure in the processing container 21 is 266 Pa (2.0 Torr) within a range of 40 to 400 Pa (0.3 to 3.0 Torr). The flow rate of hydrogen fluoride gas supplied from the supply source 311 is 180 sccm within a range of 50 to 200 sccm, the filling time is 15 seconds within a range of 5 to 30 seconds, and the supply time of hydrogen fluoride gas per cycle is 0.1 seconds within a range of 0.1 to 2 seconds. The flow rate of ammonia gas supplied from the supply source 321 is 200 sccm within a range of 50 to 200 sccm, the sublimation time per cycle is 90 seconds within a range of 30 to 90 seconds, and the number of repetitions is 5 within a range of 2 to 10.

In this way, in the etching device 141, after the COR process is performed, the processing container 21 is forced to be exhausted so that the hydrogen fluoride gas and the ammonia gas are discharged from the processing container 21. Next, a process for transferring the wafer W into the second processing container 41 of the heating device 142 by the substrate transfer mechanism 131 and mounting the wafer W on the second mounting table 42 is carried out. Subsequently, the second processing container 41 is closed and the PHTR process starts.

In the PHTR process, while the nitrogen gas is supplied into the second processing container 41, the second processing container 41 is exhausted by the vacuum pump 45 so that the pressure in the processing container 41 is set to, for example, 133 Pa (1.0 Torr). Further, a process for heating the second mounting table 42 to a second heating temperature higher than the heating temperature of the first heating unit 251 by the second heating unit 421 is performed. The second heating temperature is a temperature of 100° C. or higher and 200° C. or lower, for example, 175° C. Since the wafer W is heated to a heating temperature higher than the heating temperature in the COR process, the reaction product 55 or the ammonium fluoride 56 that could not be completely removed in the COR process is sufficiently sublimated. As a result, attachment such as the reaction product 55 or the ammonium fluoride 56, which is a factor that increases the resistance of the device, including the natural oxide film 54 removed in the COR process is removed from the interior of the groove 52.

In the heating device 142, when the PHTR process is terminated, the supply of the nitrogen gas stops and a transfer carry-in/carry-out port (not shown) is opened. Thereafter, for example, the wafer W is transferred to the film-forming device 143 by the substrate transfer mechanism 131 so that a Ti film is formed. Next, the wafer W is transferred to the film-forming device 144 by the substrate transfer mechanism 131 so that a TiN film is formed. Thereafter, the wafer W is transferred to the load lock chamber 12 by the substrate transfer mechanism 131, and the load lock chamber 12 is adjusted to the atmospheric pressure and then the wafer W returns to the carrier 113 on the carrier mounting unit 114 by the atmospheric transfer mechanism 111.

Although the hydrogen fluoride gas is pressurized in the above example, only the ammonia gas may be pressurized, or both of the hydrogen fluoride gas and the ammonia gas may be pressurized. FIG. 10 shows time charts representing supply states of gas when pressurization is performed on ammonia gas, and FIG. 11 shows time charts indicating supply states of gas when pressurization is performed on both hydrogen fluoride gas and ammonia gas. In FIGS. 10 and 11, contents indicated by horizontal axes and vertical axes are the same as those in the time charts of FIG. 5. In a similar manner as FIG. 5, the period shaded with diagonal lines corresponds to the period in which the hydrogen fluoride gas and ammonia gas are being filled in their corresponding supply paths 312 and 322.

The supply pipe 322 is filled with the ammonia gas by closing the valve V23 provided in the lowermost downstream side of the supply pipe 322 and opening the valve V21 and the valve V22 on the upstream side of the valve V23. In the example of FIG. 10, a time point t11 and a time point t14 correspond to time points when the filling starts, and a time point t12 and a time point t15 correspond to time points when the valve V23 is opened and the pressurized ammonia gas is supplied into the processing container 21. In this example, the supply of the hydrogen fluoride gas and the filling of the ammonia gas start at the time point t11 and the time point t14, and then the ammonia gas is supplied at the time point t12 and the time point t15. For this reason, a period for supplying the pressurized ammonia gas onto the wafer W is shorter than a period for supplying the unpressurized hydrogen fluoride gas onto the wafer W. In FIG. 10, a period from the time point t13 to the time point t14 correspond to a period in which the reaction product is sublimated and removed, and the natural oxide film 54 is etched in the same manner as in the above-described embodiment except that the ammonia gas instead of the hydrogen fluoride gas is pressurized.

Examples of preferable ranges of processing conditions when the ammonia gas is pressurized to perform the COR process will be given. The heating temperature of the mounting table 25 is 90° C. within a range of 60 to 100° C., and the pressure in the processing container 21 is 266 Pa (2.0 Torr) within a range of 40 to 400 Pa (0.3 to 3.0 Torr). The flow rate of ammonia gas supplied from the supply source 321 is 170 sccm within a range of 50 to 200 sccm, the filling time is 20 seconds within a range of 5 to 30 seconds, and the supply time of ammonia gas per cycle is 0.1 seconds within a range of 0.1 to 2 seconds. The flow rate of hydrogen fluoride gas supplied from the supply source 311 is 180 sccm within a range of 50 to 200 sccm, the sublimation time is 90 seconds within a range of 30 to 90 seconds, and the number of repetitions is 5 within a range of 2 to 10.

As shown in FIG. 11, when both of the hydrogen fluoride gas and the ammonia gas are pressurized, the filling of the gases starts at a time point t21 and a time point t24. Further, at a time point t22 and a time point t25, a process for supplying the pressurized gases onto the wafer W to obtain a reaction product starts. Next, at a time point t23, a process for sublimating and removing the reaction product starts. In this way, the natural oxide film 54 is etched in the same manner as described above except that both of the hydrogen fluoride gas and the ammonia gas are pressurized.

According to the above-described embodiment, a process for heating the wafer W to the heating temperature of 60° C. or higher and modifying the silicon oxide film (natural oxide film) by the process gas to obtain the reaction product and a process for heating the wafer W to the heating temperature to remove the reaction product are repeated. Further, when the process gas (hydrogen fluoride gas in this example) is supplied, the process gas is pressurized in the supply path 312 and then is supplied onto the wafer W. For this reason, the silicon oxide film 54 on the surface of the wafer can be efficiently etched and removed.

That is, since the process gas is supplied onto the wafer W heated to the heating temperature of 60° C. or higher, the reaction product 55 is generated and sublimated at the same time as described above, and thus the amount of the reaction product 55 remaining on the wafer W is reduced. Further, since the etching is gradually performed by alternately repeating the generation of the reaction product 55 and the removal of the reaction product 55 by sublimation, the deposition of the reaction product 55 or the ammonium fluoride 56 at the opening of the groove 52 is suppressed, and thus the opening of the groove 52 is secured. Therefore, the process gas can reach the bottom portion 53 of the groove 52 as well, and the silicon oxide film (natural oxide film) 54 of the bottom portion 53 is etched.

Further, since the pressurized process gas is supplied, a large amount of process gas may be instantaneously supplied onto the wafer W, and the amount of the process gas adsorbed on the wafer W may be increased. As a result, as described above, the silicon oxide film 54 on the bottom portion 53 of the groove 52 can be efficiently etched, the roughness problem that occurs when the heating temperature is high can be resolved and the influence of a state of the surface of the base film can be improved.

Specifically, it is understood that the likelihood that the process gas is absorbed on the wafer W is lowered at the heating temperature of 60° C. or higher and, particularly, 80° C. or higher. As described above, when the likelihood of adsorption of the process gas is low and the process gas is supplied at a constant flow rate without being pressurized, it becomes difficult to supply a sufficient amount of etching gas into the groove 52. As a result, portions that absorb the process gas and thus are etched and portions that do not absorb the process gas and thus are not etched are spread out on the silicon oxide film formed on the bottom portion 53 side of the groove 52 or on the side surface of the groove 52, leading to degradation of roughness. Further, as described above, in the process at 60° C. or higher, generation and sublimation of the reaction product 55 occur at the same time. For this reason, it is believed that the presence of certain portions on the silicon oxide film 54 formed in the groove 52 that can be easily etched due to the direct reach of the process gas is one of causes that degrade the roughness.

Meanwhile, in the method of the present disclosure, the process gas is first pressurized in the supply pipe, and then is supplied onto the wafer W at one time. As a result, a large amount of process gas is instantaneously sprayed onto the wafer W, and thus the adsorption amount of the gas is increased and a decrease in the likelihood of adsorption is suppressed. In this way, the adsorption amount of the process gas is increased and the etching proceeds over the entire inner surface of the groove 52, and thus aggravation of roughness is suppressed.

Further, when the likelihood of adsorption of the process gas is lowered, it is easily affected by the state of the surface of the base film that adsorbs the progress gas. However, in the method of the present disclosure, a decrease in the likelihood of adsorption of the process gas is suppressed, and thus the above issue is also improved. The effect of the base film is that an incubation time differs depending on the film type and film quality of the base film, and it is understood that the incubation time for a base film having a hydrophobic surface is longer than that for a base film having a hydrophilic surface. The incubation time refers to a time from when the process gas is supplied onto the wafer W until the etching starts. Examples of the hydrophobic surface include a thermal oxide film and the like, and examples of the hydrophilic surface include a silicon oxide film formed by tetraethyl orthosilicate (TEOS) and a silicon oxide film formed by ALD. When the likelihood of adsorption of the process gas is low, it is difficult to perform the etching, and thus the process gas may further affect the incubation time depending on the surface condition of the base film.

On the other hand, in the method of the present disclosure, as described above, the pressurized process gas is instantaneously supplied to improve the likelihood of adsorption of the process gas, and thus the etching can proceed more easily compared to the case in which the process gas is supplied without being pressurized. For this reason, the etching of the silicon oxide film is rapidly performed regardless of the state of the surface of the base film, and thus the dependence on the surface of the base film is lowered.

Further, as will described below in an embodiment, etch selectivity in a process in which hydrogen fluoride gas is pressurized is different from etch selectivity in a process in which ammonia gas is pressurized. For this reason, in the method of the present disclosure, the etch selectivity may be adjusted by selecting the process gas to be pressurized according to the constituent material or structure of the device formed on the surface of the wafer W and according to the contents of other processes performed before and after the COR process and the PHTR process, etc. Furthermore, the etch selectivity may be adjusted according to the above conditions by adjusting a gas ratio of the hydrogen fluoride gas and the ammonia gas.

As described above, in the method of the present disclosure, at least one process gas of the hydrogen fluoride gas and the ammonia gas may be pressurized and supplied into the processing container, and the process gas to be pressurized or the gas ratio of the hydrogen fluoride gas and the ammonia gas may be appropriately selected. For this reason, in order to secure a desired etching rate according to the type of insulating film 51, the shape of the groove 52, the thickness of the silicon oxide film 54, and the like, the process gas to be pressurized or the gas ratio is appropriately selected.

As described above, the process gas is pressurized in the flow path and then supplied into the processing container, and thus a large amount of process gas is instantaneously supplied onto the wafer W to increase the likelihood of adsorption. As a result, the required amount of process gas for etching the silicon oxide film 54 formed on the wafer W is supplied, and thus the etching is efficiently performed. Here, in order to increase the likelihood of adsorption of the process gas, it is also possible to continuously supply an excessive amount of etching gas. However, in such method, there is a risk that the insulating film 51, as well as the silicon oxide film 54 made of the natural oxide film, may be etched, and, thus, this is not an advantageous strategy.

Furthermore, in the above-described example, generation of the reaction product 55 and removal of the reaction product 55 by sublimation are alternately repeated in the same processing container 21. For this reason, compared to the case in which these processes are performed in different processing containers 21, the time required for transferring the wafer W or the time required for adjusting the temperature is reduced, and thus a total processing time is reduced and throughput is improved. Further, since generation and sublimation of the reaction product 55 are performed at the same heating temperature, temperature adjustment for cooling the wafer W to a temperature (e.g., 27° C.) of the conventional COR process (e.g., 27° C.) after the reaction product 55 or the like is sublimated becomes unnecessary, and thus a decrease in throughput is suppressed. Furthermore, in the above-described example, since the process gas is pressurized by filling the flow path comprised of the supply pipe with the process gas, it is possible to improve the etching efficiency of the silicon oxide film by using existing equipment.

Furthermore, after the process in which the reaction product is obtained in the etching device 141 and the process in which the reaction product is sublimated are alternately repeated, the wafer W is heated by the heating device 142. In this way, since the wafer W is processed in different processing containers 21 and 41 at different heating temperatures, a temperature adjustment time is shortened compared to the case in which the wafer W is processed in a common processing chamber, and thus a decrease in throughput is suppressed.

As described above, in the present disclosure, when the silicon oxide film can be sufficiently removed in the COR process in the etching device 141, it is not necessary to perform the PHTR process. Further, at least one of the hydrogen fluoride gas and the ammonia gas may be pressurized by connecting a tank to the supply pipe and, at the same time, closing a valve provided between the tank and the wafer W. In this case, the tank used for the pressurization also constitutes a flow path.

The structure of the substrate processed in the etching processing system described above is not limited to that described in the above-described embodiment. Further, the etching process of the present disclosure is not limited to removal of the silicon oxide film formed on the inner surface of the groove on the surface of the substrate and is applicable to etching of the silicon oxide film on the surfaces of various substrates. The silicon oxide film on the surface of the substrate to be etched is not limited to the natural oxide film and may be a different type of silicon oxide film formed by a different film forming method. For example, the etching process of the present disclosure may be applied to etching a silicon oxide film formed by a CVD method, a chemical oxide film formed by a chemical treatment such as resist removal, a thermal oxide film formed by a thermal oxidation method, or the like.

Examples

Figure 12:
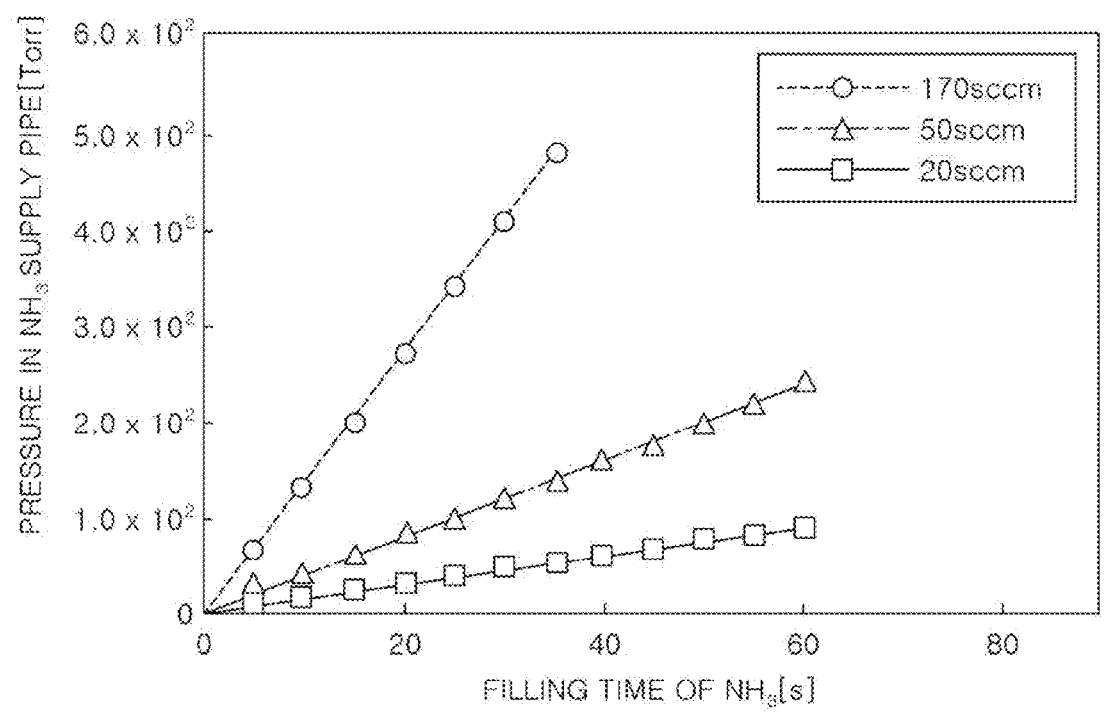
FIG. 12 is a first characteristic diagram showing results of a preliminary test.

FIG. 12 shows results of a preliminary experiment for confirming the pressurization of the process gas, and is a characteristic diagram showing a relationship between the filling time of ammonia gas and the pressure in the supply pipe 322 when the supply pipe 322 is filled with the ammonia gas. In this drawing, the horizontal axis represents a filling time of ammonia gas and the vertical axis represents pressure in the supply pipe. The filling of ammonia gas was performed by opening the valve V21 and the valve V22 of the supply pipe 322 and closing the valve V23, and the pressure in the supply pipe was measured by the pressure detection unit P2. Further, the flow rate of the ammonia gas was changed to 20 sccm, 50 sccm, or 170 sccm for filling, and a time-dependent change in each pressure of the supply pipe was obtained.

In FIG. 12, a square plot, ■, shows a detection result at 20 sccm, a triangular plot, Δ, shows a detection result at 50 sccm, and a circular plot, O, shows a detection result at 170 sccm. From the results, it was confirmed that, regardless of the flow rate of the gas, the pressure in the supply pipe increased as the filling time increased and the pressure in the supply pipe increased as the supply flow rate increased. From this experiment, it was confirmed that the process gas can be pressurized by filling the supply pipe with the process gas, and a degree of the pressurization of the gas may be controlled by the supply flow rate of the gas and the filling time.

Figure 13:
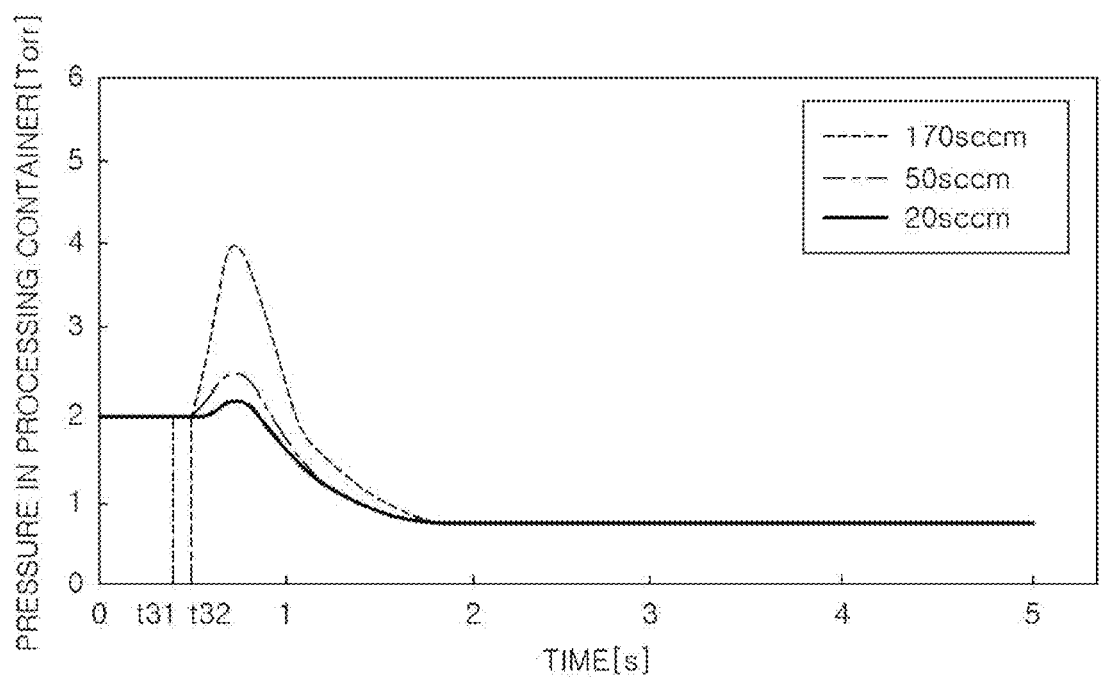
FIG. 13 is a second characteristic diagram showing results of a preliminary test.

FIG. 13 is a characteristic diagram showing results of a preliminary experiment for confirming the pressure change in the processing container 21 when the pressurized ammonia gas is supplied to the processing container 21. In the drawing, the horizontal axis represents time and the vertical axis represents pressure in the processing container 21. The filling of ammonia gas was performed by changing the flow rate of the gas to 20 sccm, 50 sccm, or 170 sccm, and a time-dependent change in each pressure of the processing container 21 was obtained. A time point t31 represents a supply start time of the pressurized ammonia gas into the processing container 21, and a time point t32 represents a supply end time of the ammonia gas.

In FIG. 13, a solid line shows detection results at 20 sccm, a dot-dash shows detection results at 50 sccm, and a broken line shows detection results at 170 sccm. From the results, it was confirmed that, regardless of the flow rate of the gas, when the pressurized ammonia gas is supplied into the processing container 21, the pressure in the processing container 21 instantaneously increased immediately after the supply of the ammonia gas, and an amount of change in the pressure in the processing container 21 increased as the flow rate of the gas increased. From this experiment, it was confirmed that, by supplying the pressurized process gas into the processing container 21, a large amount of process gas may be instantaneously supplied onto the wafer W, and the instantaneous supply amount of the process gas may be controlled according to a degree of the pressurization.

Figure 14:
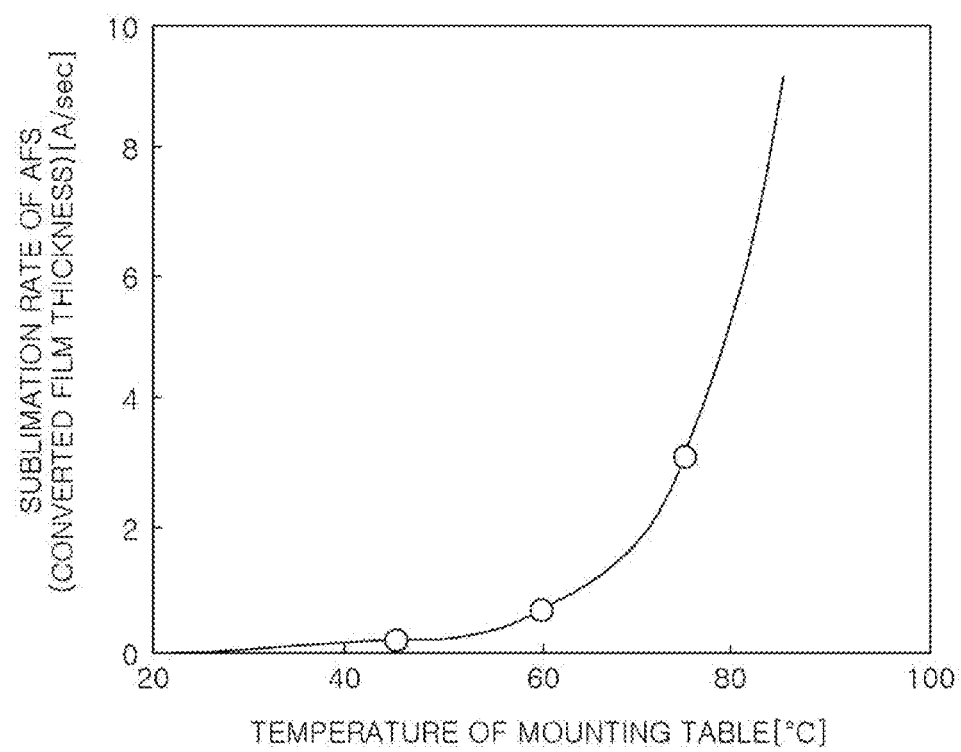
FIG. 14 is a third characteristic diagram showing results of a preliminary test.

FIG. 14 is a characteristic diagram showing results of a preliminary experiment for confirming a relationship between the heating temperature of the mounting table 25 and a sublimation rate of AFS (reaction product). In the drawing, the horizontal axis represents the temperature of the mounting table 25 and the vertical axis represents the sublimation rate of the AFS. In this experiment, under processing conditions described below, a 5 nm thermal oxide film was etched to deposit the AFS, and then the wafer W was taken out of the processing container 21 in which the etching has been performed. Next, a film thickness was measured by an ellipsometer in which a measurement recipe for measuring the film thickness of the silicon oxide film was set. It is difficult for the ellipsometer to measure an accurate film thickness without using the measurement recipe calibrated for each film type, but a relative amount of change in the film thickness can be grasped. Hereinafter, the film thickness of the AFS measured by the above recipe may be referred to as a "converted film thickness (corresponding to silicon oxide film)" or the like. In this way, the wafer W, on which the converted film thickness of the deposited AFS was measured, was loaded back into the processing container 21 in which the etching was performed, the temperature of the mounting table 25 was changed (45, 60, or 75° C.), and the AFS was sublimated in the state of FIG. 8. Thereafter, the converted film thickness of the AFS remaining without being sublimated was measured, and the converted film thickness of the sublimated AFS was calculated by deriving a difference before and after the sublimation. Further, for a plurality of conditions in which the sublimation processing time (vacuum exhaust time by the vacuum pump 24) was changed for each temperature of the mounting table 25, the above-described converted film thickness of the sublimated AFS was obtained, and thus a sublimation rate was obtained. In addition, the converted film thickness of the entire AFS without the sublimation process was obtained from a difference in the converted film thickness measured at the stage after the thermal oxidation film was etched to deposit AFS and the stage after the AFS was removed. At the time of the removal of the AFS, the PHTR process was performed in the heating device 142 under the condition of the heating temperature of 175° C.

Processing conditions in the etching device 141 for a process of etching a 5 nm thermal oxide film to deposit the AFS will be described. The pressure in the processing container 21 was set to 66.6 Pa, the flow rate of the hydrogen fluoride gas was set to 20 sccm, the flow rate of the ammonia gas was set to 20 sccm, and the supply time was set to 13 seconds. Further, the process of sublimating the AFS was performed by mounting the wafer W on the mounting table 25 in the processing container 21 of the etching device 141 and changing a temperature of the mounting table 25 and a vacuum exhaust time by the vacuum pump 24.

As a result, it was confirmed that, when the temperature of the mounting table 25 was 60° C. or higher, the AFS was sublimated and removed and, particularly, when the temperature of the mounting table 25 was 80° C., the sublimation was performed. As a result, it was understood that the COR process is preferably performed at a heating temperature of 60° C. or higher and, particularly, at a heating temperature of 80° C. higher.

Figure 15:
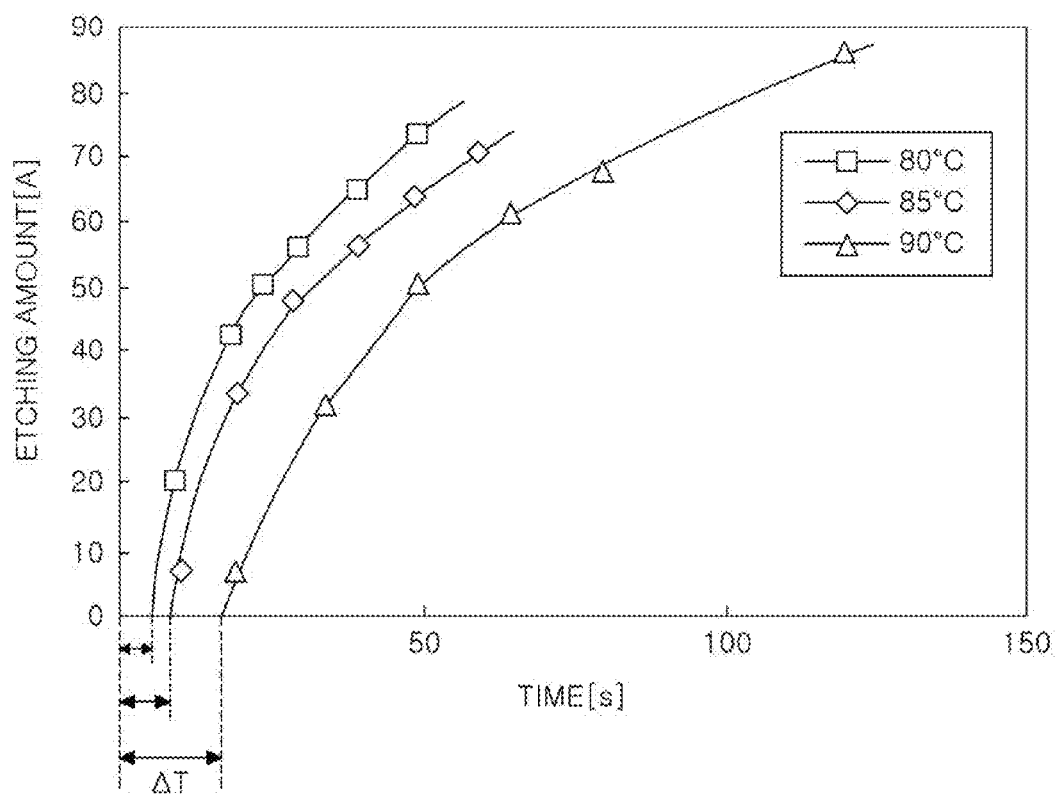
FIG. 15 is a fourth characteristic diagram showing results of a preliminary test.

FIG. 15 is a characteristic diagram showing results of a preliminary experiment for confirming a relationship between the heating temperature of the wafer W and an etching amount in the COR process. In the drawing, the horizontal axis represents time and the vertical axis represents etching amount. The wafer W on which the silicon oxide film has been formed was mounted on the mounting table 25 of the etching device 141 shown in FIG. 2 and an etching amount when the hydrogen fluoride gas and the ammonia gas were supplied without being pressurized was measured by changing the heating temperature of the mounting table 25. In FIG. 15, a square plot, ■, shows a detection result at 80° C., a diamond plot, ◇, shows a detection result at 85° C., and a triangular plot, Δ, shows a detection result at 90° C.

In FIG. 15, the measurement started at the supply start time of the process gas, and in the drawing, AT denotes an incubation time, which is time from the start of supply of the process gas to the start of etching. As a result, it was confirmed that the incubation time AT increased as the heating temperature of the mounting table 25 increased. It is presumed that this is because the likelihood of adsorption of the process gas decreased as the heating temperature of the wafer increased. For this reason, in the present disclosure, at least one of the hydrogen fluoride gas and the ammonia gas was pressurized and supplied. As a result, as described above, the adsorption amount of the process gas increased so that the likelihood of adsorption increased. In addition, as can be seen from the experimental result, the incubation time increased as the heating temperature of the wafer W increased, and thus it is understood that an upper limit of the heating temperature in the COR process is preferably set to 100° C.

FIG. 16 shows pieces of image data showing results of an evaluation experiment for confirming an effect of improving roughness. In the etching device 141 of FIG. 2, the process in which the hydrogen fluoride gas was pressurized and supplied, the silicon oxide film was modified, and the reaction product was obtained and the process in which the reaction product was sublimated were alternately repeated, and then the state of the surface of the wafer W was measured. The processes were performed under the above-described conditions, and the number of repetitions was four. The state of the surface of the wafer W was imaged using transmission electron microscopy (TEM). Further, bottom clean efficiency (BCE) was obtained by (etching amount of the natural oxide film on the surface of the wafer W)/(etching amount of the natural oxide film on the bottom 53)×100(%).

As a comparative example, in the etching device 141 of FIG. 2, the silicon oxide film was also etched in the case in which the hydrogen fluoride gas was supplied without being pressurized, and the state of the surface of the wafer W was measured in the same manner. As the processing conditions, the heating temperature of the mounting table 25 was set to 85° C., the pressure in the processing container 21 was set to 60 Pa, the flow rate of the hydrogen fluoride gas was set to 150 sccm, the flow rate of the ammonia gas was set to 90 sccm, the supply time was set to 5.3 seconds, the sublimation time was set to 60 seconds, and the number of repetitions was set to three.

Figure 16A:
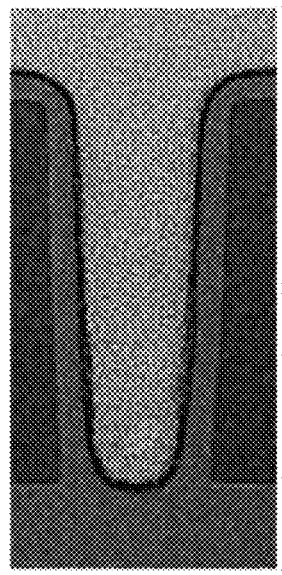
FIGS. 16A and 16B show pieces of image data showing results of an evaluation test.
Figure 16B:
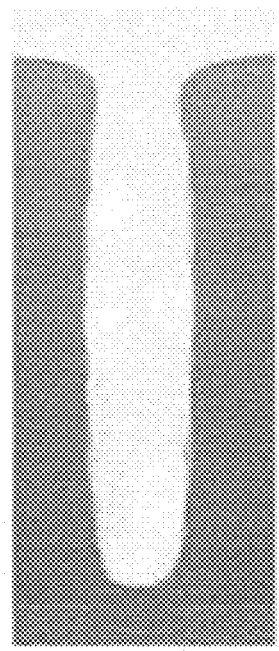

A result of an example is shown in FIG. 16A and a result of a comparative example is shown in FIG. 16B. As a result, focusing on the inner side surface of the groove, it was confirmed that the example does not show any degradation in roughness as compared with the comparative example. As a result, it was confirmed that, by pressurizing and supplying the process gas as in the present disclosure, the adsorption amount of the process gas is increased, and thus the roughness is improved even in the process at a high temperature of 80° C. or higher. Furthermore, the BCE of the comparative example was 57.4% compared to 100% for the example, and it was recognized that the silicon oxide film formed on the surface of the wafer W can be efficiently removed by the method of the present disclosure.

Further, as a result of measuring the state of the surface of the wafer W which was processed by changing the number of repetitions under the conditions of examples, it was understood that the opening width of the groove was increased as the number of repetitions was increased, and thus the reaction product on the inner side surface and the bottom portion of the groove was removed (not shown). From the above, it was confirmed that, by alternately repeating the process in which the wafer W was heated to 60° C. or higher, hydrogen fluoride gas was pressurized and supplied, and the silicon oxide film was modified to obtain a reaction product, and the process in which the reaction product was sublimated, the silicon oxide film was efficiently etched and removed.

Figure 17:
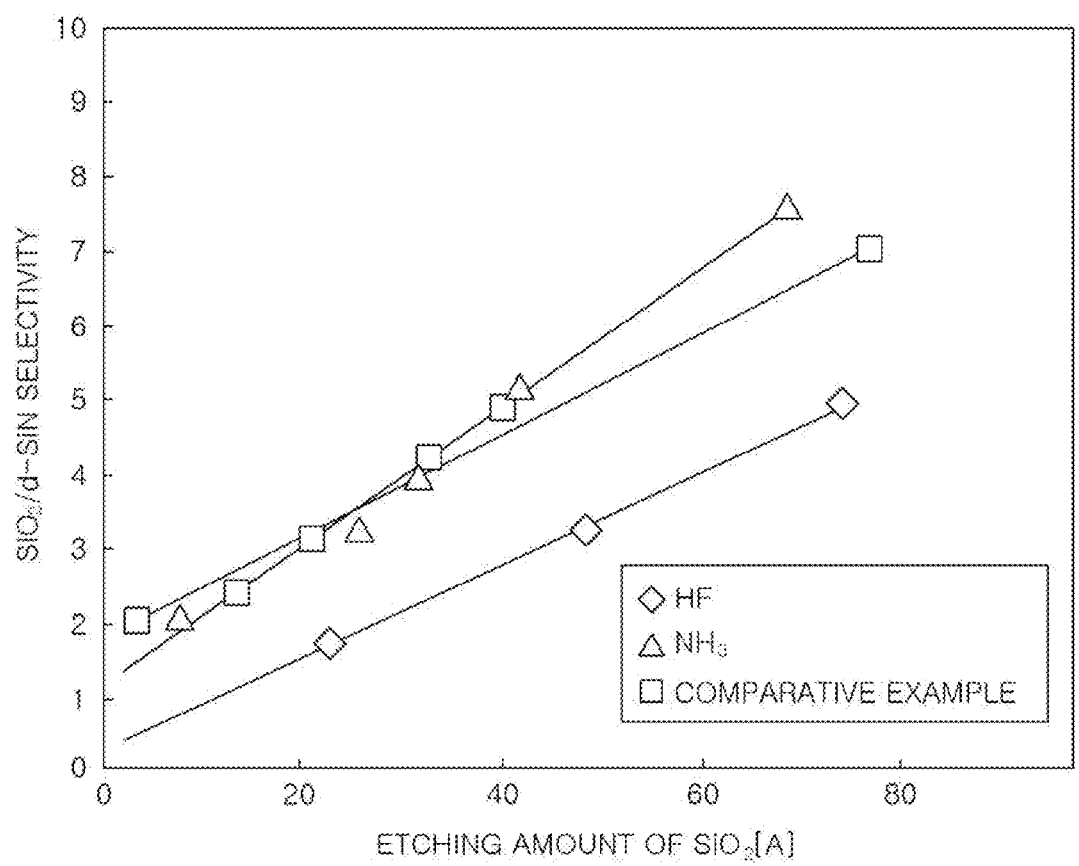
FIG. 17 is a characteristic diagram showing results of an evaluation test.

FIG. 17 shows results of an evaluation experiment for confirming etch selectivity. In FIG. 17, the horizontal axis represents an etching amount of the natural oxide film (SiO2 film) and the vertical axis represents SiO2/d-SiN selectivity. The d-SiN refers to a SiN film whose surface has been damaged by plasma ashing or the like. In the etching device 141 of FIG. 2, the etch selectivity was measured for each of the case in which only the hydrogen fluoride gas is pressurized and supplied and the case in which only the ammonia gas is pressurized and supplied. Each etching process was performed under the above-described conditions, and as a comparative example, etch selectivity was measured in the same manner when the COR process was performed at a temperature of 60° C. or lower, for example, 27° C. by a conventional method.

Figure 3:
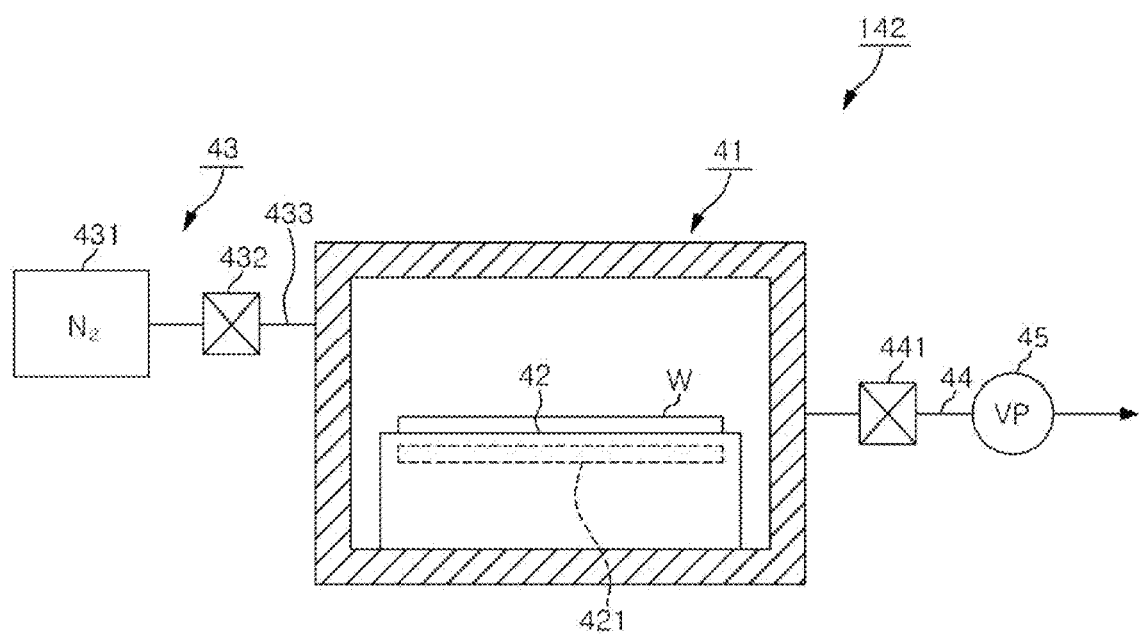
FIG. 3 is a longitudinal side view showing an example of a heating device installed in the etching processing system.

In the comparative example, after the silicon oxide film and the process gas reacted with each other in the etching device of FIG. 2, a process in which the wafer W was transferred to the heating device of FIG. 3 and the wafer W was heated to, for example, 175° C., was performed one time. As processing conditions in the etching device, the pressure in the processing container 21 was set to 66.6 Pa, the flow rate of the hydrogen fluoride gas was set to 20 sccm, the flow rate of the ammonia gas was set to 20 sccm, and the supply time was set to 13 seconds. In addition, the pressure in the processing container 41 in the heating device was set to 133 Pa, and the processing time was set to 55 seconds.

In FIG. 17, a diamond plot, ◇, shows a detection result of an example in which the hydrogen fluoride gas is pressurized, a triangular plot, Δ, shows a detection result of an example in which the ammonia gas is pressurized, and a square plot, ■, shows a detection result of the comparative example. As a result, it was confirmed that etch selectivity in the case in which the hydrogen fluoride gas is pressurized differs from etch selectivity in the case in which the ammonia gas is pressurized. Further, with respect to the etch selectivity of the natural oxide film and the d-SiN film, it was confirmed that, when a target etching amount of the natural oxide film was 30 Å, etch selectivity equivalent to that of the comparative example may be secured by pressurizing the ammonia gas.

In this embodiment, it was assumed that the d-SiN film was formed on the side wall of the groove 52 and the natural oxide film was formed on the bottom portion 53 of the groove 52. In this case, it can be said that the process of pressurizing the ammonia gas is effective. However, the same amount of etching of the natural oxide film and the SiN film may be required, and in such case, the process of pressurizing the hydrogen fluoride gas is effective. In the method of the present disclosure, etch selectivity differs according to the type of process gas to be pressurized. Therefore, etch selectivity may be controlled by adjusting a gas ratio of the hydrogen fluoride gas and the ammonia gas, and required etch selectivity may be satisfied.

It should be considered that the disclosed embodiments are exemplary in all respects and not restrictive. The embodiments may be omitted, replaced, and changed into various forms without departing from the appended claims and their gist.

What is claimed is:

1. A method of etching silicon oxide on a surface of a substrate, the method comprising:
   alternately repeating a process of heating the substrate on which the silicon oxide is formed to a heating temperature of 60° C. or higher, supplying hydrogen fluoride gas and ammonia gas onto the substrate to react with the silicon oxide, and modifying the silicon oxide to obtain a reaction product, and a process of removing at least a portion of the reaction product from the substrate while stopping the supply of the hydrogen fluoride gas and the ammonia gas and continuing to heat the substrate at the heating temperature; and
   when a process gas that is at least one of the hydrogen fluoride gas and the ammonia gas is supplied, while continuing to supply the process gas from an upstream side of a flow path for supplying the process gas to the substrate, closing a valve disposed between the substrate and the flow path to pressurize the process gas in the flow path, and then opening the valve.

2. The method of claim 1, wherein the silicon oxide is formed on an inner surface of a groove formed in the surface of the substrate.

3. The method of claim 1, wherein a period for obtaining the reaction product includes a period in which a flow rate of the pressurized process gas supplied to the substrate is greater than a flow rate of the process gas that would have been supplied to the substrate if the process gas had been continuously supplied without being pressurized.

4. The method of claim 1, wherein the pressurization is performed on only one process gas which is either the hydrogen fluoride gas or the ammonia gas.

5. The method of claim 4, wherein a period in which said one process gas is supplied onto the substrate is shorter than a period in which the other process gas that is not pressurized is supplied onto the substrate.

6. The method of claim 1, wherein the pressurization is performed on both the process gases of the hydrogen fluoride gas and the ammonia gas.

7. The method of claim 1, further comprising after the alternately repeating the processes, heating the substrate to a temperature higher than the heating temperature and further removing the reaction product from the substrate.

8. The method of claim 7, wherein the alternately repeating the processes and the further removing the reaction product are performed in different processing containers.

* * * * *